(12) United States Patent
He et al.

(10) Patent No.: US 12,276,814 B2
(45) Date of Patent: Apr. 15, 2025

(54) LASER BEAM COMBINING APPARATUS, AND COMBINED STEPPED REFLECTOR AND FILLING RATE CALCULATION METHOD THEREOF

(71) Applicant: KEY & CORE TECHNOLOGY INNOVATION INSTITUTE OF THE GREATER BAY AREA, Guangzhou (CN)

(72) Inventors: Qiuting He, Guangzhou (CN); Jinfu Hu, Guangzhou (CN); Shuisong Feng, Guangzhou (CN); Junhong Yang, Guangzhou (CN)

(73) Assignee: KEY & CORE TECHNOLOGY INNOVATION INSTITUTE OF THE GREATER BAY AREA, Guangzhou (CN)

( * ) Notice: Subject to any disclaimer, the term of this patent is extended or adjusted under 35 U.S.C. 154(b) by 497 days.

(21) Appl. No.: 17/749,072

(22) Filed: May 19, 2022

(65) Prior Publication Data

US 2023/0041947 A1 Feb. 9, 2023

Related U.S. Application Data

(63) Continuation of application No. PCT/CN2021/105789, filed on Jul. 12, 2021.

(51) Int. Cl.
*G02B 5/08* (2006.01)
*G02B 27/00* (2006.01)
*H01S 5/40* (2006.01)

(52) U.S. Cl.
CPC ....... *G02B 5/0816* (2013.01); *G02B 27/0012* (2013.01); *H01S 5/4025* (2013.01)

(58) Field of Classification Search
CPC .............. G02B 5/0816; G02B 27/0012; G02B 27/143; G02B 27/106; H01S 5/4025
See application file for complete search history.

(56) References Cited

U.S. PATENT DOCUMENTS

| | | | | |
|---|---|---|---|---|
| 5,343,489 A | * | 8/1994 | Wangler | G02B 27/48 372/700 |
| 2008/0063017 A1 | * | 3/2008 | Schnitzler | H01S 5/4025 372/50.124 |
| 2009/0067170 A1 | * | 3/2009 | Bloemen | F21V 13/04 359/850 |

FOREIGN PATENT DOCUMENTS

| | | |
|---|---|---|
| CN | 1168745 A | 12/1997 |
| CN | 101000444 A | 7/2007 |

(Continued)

*Primary Examiner* — Mariam Qureshi

(57) ABSTRACT

A laser beam combining apparatus, and a combined stepped reflector and a filling rate calculation method thereof are disclosed. The laser beam combining apparatus includes a two-dimensional light-emitting array and the combined stepped reflector used to reflect a plurality of laser beams emitted by the two-dimensional light-emitting array. The combined stepped reflector is composed of a plurality of reflective mirrors that have the same length but sequentially increasing widths and that are stacked in succession, where the distance between centers of the laser beams reflected by the combined stepped reflector is smaller than the distance between centers of the laser beams prior to the incidence, thus increasing the filling rate of the laser beams emitted by the two-dimensional light-emitting array. A method for calculating the filling rate of the laser beam combining apparatus is also provided.

4 Claims, 2 Drawing Sheets

(56) References Cited

FOREIGN PATENT DOCUMENTS

| | | | |
|---|---|---|---|
| CN | 101285904 | A | 10/2008 |
| CN | 102081179 | A | 6/2011 |
| JP | H0580272 | A | 4/1993 |

\* cited by examiner

LASER BEAM COMBINING APPARATUS, AND COMBINED STEPPED REFLECTOR AND FILLING RATE CALCULATION METHOD THEREOF

CROSS-REFERENCE TO RELATED APPLICATIONS

This application is a continuation of co-pending International Patent Application Number PCT/CN2021/105789, filed on Jul. 12, 2021, the disclosure of which is incorporated herein by reference in its entirety.

TECHNICAL FIELD

The present disclosure relates to the technical field of semiconductor lasers, and more particularly relates to a laser beam combining apparatus, and a combined stepped reflector and a filling rate calculation method thereof.

BACKGROUND

In order to accommodate to a wider range of applications, it is necessary to continuously increase the optical power density of the laser. To increase the optical power density, it is necessary to increase the filling rate of the laser beams. Nowadays, there are two primary methods to improve the filling rate of the laser beams. The first method is to increase the filling rate of the laser beams by placing more laser chips per unit area. Specifically, by reducing the physical distances between the laser chips, more laser chips can be accommodated in the same area, thereby increasing the filling rate. The second method is to reduce the spacing of laser beams by placing stepped reflective mirrors in the light-emitting direction on the basis of retaining the physical spacing of the laser chips, so that more laser beams can be accommodated in a unit area, thereby improving the filling rate.

However, a sufficient physical distance between the laser chips needs to be ensured for the purpose of ensuring the heat dissipation effect, so as to maximize the power and the service life of the laser. Thus, when the first method is used to improve the filling rate, the physical spacing of the laser chips can only be reduced within a certain range, hence subject to significant limitations and the filling rate can only be improved to a limited extent. Regarding the second method, there are two types of stepped reflectors that are used. One is an integrated stepped reflector, which have the following disadvantages. In particular, the structure of the integrated stepped reflector is designed to reflect the laser beam in the thickness direction, which is difficult to process, resulting in high processing costs, and it is difficult to meet high precision requirements. Furthermore, the overall thickness and weight of the integrated stepped reflector will increase significantly, which is not conducive to the integration of a miniaturized system. In addition, due to the one-piece stepped shape, when polishing the reflecting surface for reflecting the laser beams, there is only a single direction, the reflecting surface has a low smoothness, and the parallelism error between the reflecting surfaces is large. Low smoothness and large parallelism errors will increase losses and reduce reflectivity. In addition, the one-piece structure is not able to adapt to the directivity errors present in the encapsulation of different laser chips, and it will also increase the losses and reduce the reflectivity. The other type is a stepped reflective mirror composed of separate reflective mirrors, each of which exists independently. However, since each separate mirror has a different shape, it needs to be individually customized, such that the structure becomes complicated, and the production cost will increase significantly.

Therefore, in general, both of the above two methods have limitations and many defects, and cannot meet the requirement of improving the filling rate of the laser beams.

SUMMARY

It is therefore one object of the present disclosure to provide a laser beam combining apparatus, a combined stepped reflector and a filling rate calculation method thereof, where the combined stepped reflector is simple to process, low in cost, high in surface smoothness and parallelism of the reflecting surface, beneficial to improve the filling rate of the laser beams, and furthermore, it can adapt to the directivity errors present in the encapsulation of different laser chips.

In order to achieve the aforementioned object of the present disclosure, one aspect of the present disclosure provides a combined stepped reflector for reflecting multiple laser beams emitted by a two-dimensional light-emitting array. The combined stepped reflector is comprised of multiple reflective mirrors with the same length but different widths that are stacked in sequence. The multiple mirrors include an outermost reflective mirror and a plurality of overlapping reflective mirrors sequentially stacked on the outermost mirror. Each of the overlapping reflective mirrors has an overlapping reflecting surface that overlaps a back of the previous reflective mirror and a non-overlapping reflecting surface. The non-overlapping reflecting surfaces of the plurality of overlapping reflecting mirrors have equal widths and are each coated with a reflection film. The reflective surface of the outermost reflective mirror has a width that is greater than or equal to the width of the non-overlapping reflecting surfaces. The reflective surface of the outermost reflective mirror and the non-overlapping reflecting surfaces of the plurality of overlapping reflective mirrors are each at a 45° angle with the corresponding laser beams emitted by the two-dimensional light-emitting array, so that the center distance of the laser beams reflected by the combined stepped reflector is smaller than the center distance prior to the incidence, thus improving the filling rate of the laser beams emitted by the two-dimensional light-emitting array.

In an embodiment of the present disclosure, the widths of the multiple overlapping reflective mirrors of the combined stepped reflector increase sequentially.

In an embodiment of the present disclosure, the laser beams emitted by the two-dimensional light-emitting array has the same period, and the combined stepped reflector is composed of a plurality of reflective mirrors with the same thickness.

In an embodiment of the present disclosure, the laser beams emitted by the two-dimensional light-emitting array have different periods, and the combined stepped reflector is composed of a plurality of reflective mirrors with different thicknesses, so as to adapt to the different laser beam periods of the two-dimensional light-emitting array.

In an embodiment of the present disclosure, the distance between the centers of two adjacent laser beams emitted by the two-dimensional light-emitting array is D, the width of a light spot of each laser chip of the two-dimensional light-emitting array is W, the width of the non-overlapping reflecting surface is L, the thickness of the reflecting mirror is h, and the processing adjustment allowance of the reflecting mirror is C, $C \geq 0.1$, so that according to the Pythagorean theorem, the width L satisfies. Lmin=h+√2W+C, where the thickness h of the mirror lies in the range of: 0.1 mm≤h≤8 mm.

In an embodiment of the present disclosure, the distance between the centers of two adjacent laser beams reflected by their respective reflective mirrors is d. According to the definition of the laser beam filling rate, the laser beam filling rate after reflection by the combined stepped reflector is $$K_1 = \frac{W}{d},$$

and according to the Pythagorean theorem, the laser beam center distance satisfies $$d = \frac{L-h}{\sqrt{2}},$$

and the laser beam center distance d satisfies: dmin=W

In another aspect of the present disclosure, a laser beam combining apparatus is provided, comprising a two-dimensional light-emitting array and a combined stepped reflector, where the combined stepped reflector is used to reflect a plurality of laser beams emitted by the two-dimensional light-emitting array, so that the center distance of the reflected laser beams is smaller than the center distance prior to the incidence, thereby improving the filling rate of the laser beams emitted by the two-dimensional light-emitting array that is formed by encapsulating a plurality of laser chips on a substrate.

In yet another aspect, the present disclosure further provides a method for calculating the filling rate of the laser beam combining apparatus, the method comprising:

S1. Presetting a thickness h of the reflective mirror depending on a light spot width W of a laser chip;

S2. Obtaining a width L of the non-overlapping reflecting surface of each of the overlapping reflective mirrors depending on the thickness h of the reflective mirror; and S3. Based on the thickness h of the reflective mirror and the width L of the non-overlapping reflecting surface, calculating the filling rate of the laser beams reflected by the laser beam combining apparatus.

In an embodiment of the present disclosure, the distance between the centers of two adjacent laser beams emitted by the two-dimensional light-emitting array is D, and the period between the laser chips of the two-dimensional light-emitting array is P, where P=D. The light spot width of the laser chip is W, the thickness of the reflecting mirror is h, the width of the non-overlapping reflecting surface is L, and the distance between the centers of the rays reflected by the respective mirrors of two adjacent laser beams is d. The non-overlapping reflecting surfaces are each placed at a 45° angle to the laser beams emitted by the two-dimensional light-emitting array. According to the definition of the laser beam filling rate, we have:

The initial fill rate of the collimated laser beams:

$$K_0 = \frac{W}{P} = \frac{W}{D} \qquad (1)$$

The filling rate of laser beams after reflection:

$$K_1 = \frac{W}{d} \qquad (2)$$

According to the Pythagorean theorem, we have:

$$D = \frac{L-h}{\sqrt{2}} + \sqrt{2}h \qquad (3)$$

$$d = \frac{L-h}{\sqrt{2}} \qquad (4)$$

Convert ③ we get:

$$D = \frac{L+h}{\sqrt{2}} \qquad (5)$$

The processing adjustment allowance of the mirror is C, C≥0.1. According to the Pythagorean theorem, the width L satisfies:

$$L\ \text{min}=h+\sqrt{2}W+C \qquad (6)$$

The thickness h of the reflective mirror lies in the range of: 0.1 mm≤h≤8 mm;

According to the Pythagorean theorem, the ray center distance d satisfies:

$$d\ \text{min}=W \qquad (7).$$

In an embodiment of the present disclosure, in operation S2, the center distance D and the thickness h of the reflective mirror are substituted into formula ⑤ to calculate the width value L, and the light spot width W of the laser chip and the preset width h of the reflective mirror are substituted into formula ⑥ to obtain Lmin.

In one embodiment of the present disclosure, in operation S3, the value L greater than Lmin and the preset thickness h of the reflective mirror is substituted into formula ④ to obtain the light center distance value d, and the value of the light spot width W is substituted into formula ⑦ to obtain dmin. Finally, the light spot width W of the laser chip and the value d close to dmin are substituted into formula ② to obtain the laser beam filling rate $K_1$ after reflection.

The combined stepped reflector according to the present disclosure is composed of a plurality of reflective mirrors with the same length but different widths. Each reflective mirror has a simple structure and is easy to process, which greatly reduces the processing difficulty and manufacturing cost. The surface smoothness and parallelism between the reflective surfaces can also be greatly improved. In terms of the directivity errors present in the encapsulation of different laser chips, they can also be adapted to by adjusting an individual reflective mirror to reduce the loss and improve the reflectivity.

When the laser beams have the same period, the combined stepped reflector according to the present disclosure is composed of multiple reflective mirrors with the same thickness. When the laser beams have different periods, the combination of reflective mirrors with different thicknesses can be used to adapt to different periods to meet the requirement of increasing the filling rate.

The present disclosure further provides a method for calculating the filling rate of the laser beam combining apparatus. Based on the light spot width of the laser chip, the thickness of the reflecting mirror is preset, and then the step width of the combined stepped reflector, namely the width of each of the non-overlapping reflecting surfaces of the combined stepped reflector, is calculated based on the preset thickness value of the reflective mirror. Finally, the filling rate of the laser beams is calculated based on the thickness of the reflective mirror and the width of each of the non-overlapping reflecting surfaces, which provides a calculation method for engineering applications.

Further objects and advantages of the present disclosure will be fully appreciated by an understanding of the ensuing description and drawings.

Figure 1:
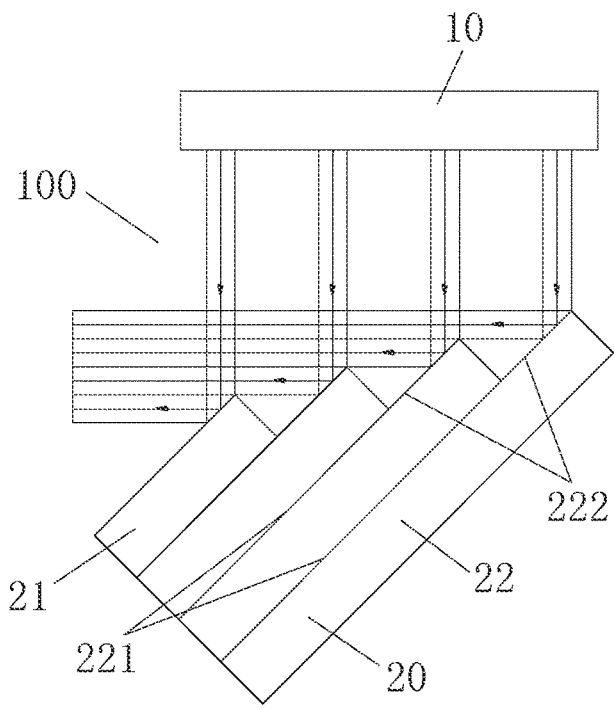
FIG. 1 is a schematic diagram illustrating a laser beam combining apparatus according to the present disclosure.

DESCRIPTION OF REFERENCE NUMERALS laser beam combining apparatus 100; two-dimensional light-emitting array 10; combined stepped reflector 20; outermost reflective mirror 21; overlapping reflective mirror 22; non-overlapping surface 221.

DETAILED DESCRIPTION

The following description serves to disclose the present invention to enable those skilled in the art to practice the present invention. The illustrative embodiments described below are given by way of example only, and other apparent modifications will be contemplated by those skilled in the art. The basic principles of the present disclosure defined in the following description may be applied to other embodiments, variations, modifications, equivalents, and other technical solutions without departing from the spirit and scope of the present disclosure.

It should be understood by those skilled in the art that in the present disclosure that the terms "longitudinal", "transverse", "up", "down", "left", "right", "front", "rear", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure.

It should be understood that the term "a" should be understood as "at least one" or "one or more", that is, in one embodiment, the number of an element may be one, while in another embodiment, the number of the elements may be plural, and the term "one" should not be construed as a limitation on the number.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection, or mutual communication. They may denote a direct connection, a connection through an intermediate, or an internal connection between two elements, or the interaction relationship between the two elements. For those of ordinary skill in the art, the specific meanings of the above terms as used in the present application can be understood depending on specific contexts.

Figure 2:
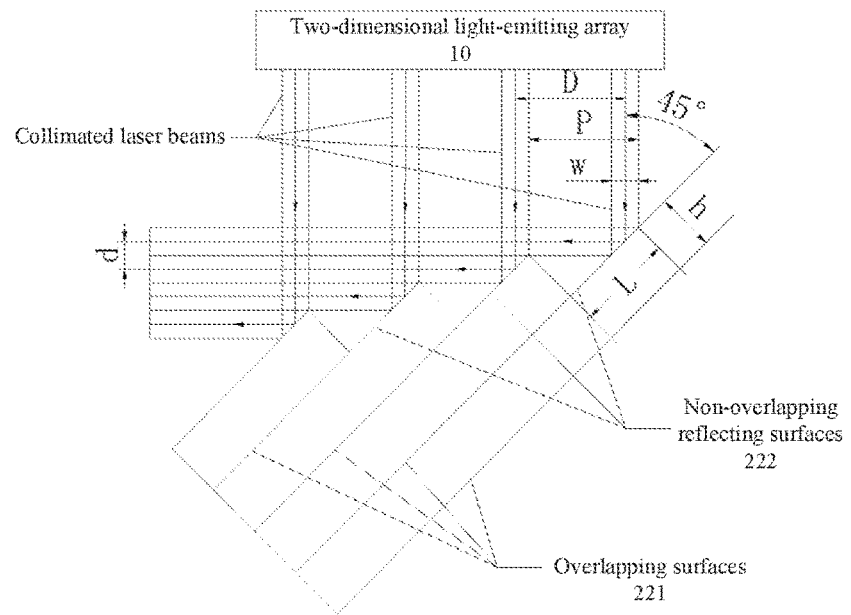
FIG. 2 is a schematic diagram illustrating various parameters of the laser beam combining apparatus shown in FIG. 1.
Figure 3:
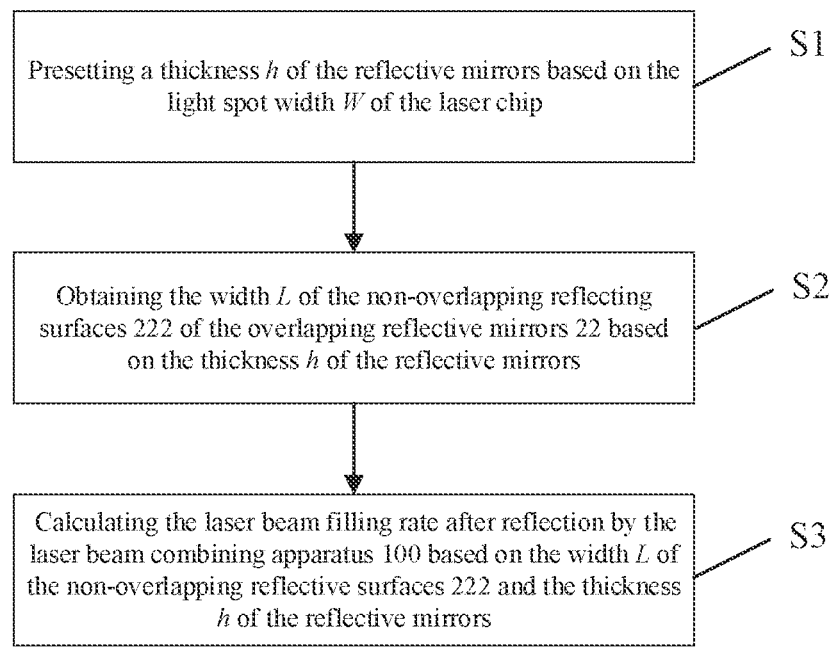
FIG. 3 is a schematic diagram illustrating a filling rate calculation method of the laser beam combining apparatus shown in FIG. 1.

As shown in FIG. 1 and FIG. 2, the structures of a combined stepped reflector 20 and a laser beam combining apparatus 100 including the combined reflective mirror according to an illustrative embodiment of the present disclosure are illustrated in detail.

Specifically, the laser beam combining apparatus 100 includes a two-dimensional light-emitting array 10 and the combined stepped reflector 20, where the combined stepped reflector 20 is used to reflect a plurality of laser beams emitted by the two-dimensional light-emitting array 10, so that the distance between the centers of the reflected laser beams is smaller than the center distance before the incidence, so as to improve the filling rate of the laser beams emitted by the two-dimensional light-emitting array 10, which is formed by encapsulating a plurality of laser chips on the substrate.

More specifically, the combined stepped reflector 20 is composed of multiple reflective mirrors with the same length but different widths that are stacked in sequence, where the multiple reflective mirrors include an outermost reflective mirror 21 and a plurality of overlapping reflective mirrors 22 that are sequentially stacked on the outermost reflective mirror 21. Each overlapping reflective mirror 22 has an overlapping surface 221 and a non-overlapping reflecting surface 222 that overlap the back surface of a previous reflective mirror. The non-overlapping reflecting surfaces 222 of the plurality of overlapping reflecting mirrors 22 have the same width and are all coated with reflection films. The width of the reflecting surface of the outermost mirror 21 is greater than or equal to the width of the non-overlapping reflecting surfaces 222. The reflecting surface of the outermost reflective mirror 21 and the non-overlapping reflecting surfaces 222 of the plurality of overlapping reflective mirrors 22 are at an 45° angle with the corresponding laser beams emitted by the two-dimensional light-emitting array 10, so that the center distance of the laser beams reflected by the combined stepped reflector 20 is smaller than the center distance before the incidence, thereby improving the filling rate of the laser beams emitted by the two-dimensional light-emitting array 10.

Particularly, in an embodiment of the present disclosure, the laser beams emitted by the two-dimensional light-emitting array 10 have the same period, and the combined stepped reflector 20 is composed of a plurality of reflective mirrors with the same thickness. When the periods of the laser beams emitted by the two-dimensional light-emitting array 10 are different, the different periods are adapted to by the combination of reflective mirrors with different thicknesses, so as to meet the requirement of increasing the filling rate.

That is to say, the present disclosure also provides a structural design method for the combined stepped reflector 20. According to the characteristics of the periods of the laser beams emitted by the two-dimensional light-emitting array 10, the laser beam combining apparatus 100 can achieve the effect of increasing the filling rate by correspondingly adjusting the thickness of the reflective mirrors used.

It is worth mentioning that, in the present disclosure, the reflective surfaces of the plurality of reflective mirrors are designed to be at an 45° angle with the corresponding laser beams emitted by the two-dimensional light-emitting array 10 in order to make the reflected laser beams just rotate 90°, such as changing from a vertical direction to a horizontal direction, so that the structural design of the combined stepped reflector 20 will be more convenient.

In addition, it is also worth mentioning that, in this illustrative embodiment of the present disclosure, the widths of the multiple stacked reflective mirrors of the combined stepped reflector 20 are gradually increasing, so as to form the stepped reflecting surfaces of the combined stepped reflector 20.

It can be understood that the laser power generated by a single semiconductor laser chip is limited, but due to the small size of its light-emitting line, two-dimensional light-emitting array 10 can be formed by encapsulating a plurality of identical laser chips on the same substrate, so that the total of the beams of the array expands the laser power. At the same time, the non-luminous interval between the array beams is inevitably caused. After the fast and slow axes are collimated, there is also a non-luminous interval between the sub-beams. Reducing or eliminating the interval between the sub-beams can improve the brightness of the beam, thus increasing the power density of the laser focus to meet the requirements of laser welding and cladding.

Therefore, in the present disclosure, the combined stepped reflector 20 is used to reflect the multiple laser beams emitted by the two-dimensional light-emitting array 10 after the fast and slow axes are collimated, so that the center distance of the reflected laser beams is smaller than that before the incidence, so as to reduce or eliminate the interval between two adjacent laser beams. Furthermore, more laser beams can be accommodated in a unit area, thereby improving the optical power density and meeting the requirements of laser welding and cladding.

Moreover, since the combined stepped reflector 20 is composed of a plurality of reflective mirrors, each reflective mirror has a simple structure and is easy to process, which greatly reduces the difficulty of manufacturing and the manufacturing cost. The smoothness and flatness of a single mirror can be processed with high precision, and the parallelism between reflecting surfaces when they are combined can also achieve high precision. High smoothness and small parallelism errors reduce the losses of laser beam reflection and improve reflectivity. When facing the directivity errors present in encapsulating different laser chips, they can be adapted to by adjusting the width of the non-overlapping coating reflecting surfaces, which can prevent the laser beams from being blocked by the edge of the mirrors which would otherwise adversely reduce the reflectivity, thereby reducing the reflected laser power.

That is, the present disclosure provides a combined stepped reflector 20 with simple processing, low cost, high surface smoothness and high parallelism precision of the reflective surfaces, which can effectively improve the filling rate of the laser beams, and can also adapt to the directivity errors present in the encapsulation of different laser chips.

In particular, as shown in FIG. 1, the center distance of two adjacent laser beams emitted by the two-dimensional light-emitting array 10 is D, the light spot width of each laser chip of the two-dimensional light-emitting array 10 is W, the width of the non-overlapping reflecting surfaces 222 is L, the thickness of the mirror is h, the processing adjustment allowance of the mirror is C, C≥0.1. According to the Pythagorean theorem, we get $$D = \frac{L-h}{\sqrt{2}} + \sqrt{2h}$$

and the width L satisfies: Lmin=h+√2W+C.

It is worth mentioning that, considering the range of the thickness of the lens used by the existing lasers for beam compression, the thickness h of the reflector is preferably in the range of: 0.1 mm≤h≤8 mm.

In addition, it is also worth mentioning that the width of the reflective surface of the outermost mirror 21 is greater than or equal to the width L of the non-overlapping reflecting surfaces 222. That is to say, when the width of the reflecting surface of the outermost mirror 21 is greater than or equal to L, the effect of reflecting the corresponding laser beams and reducing the center distance of the laser beams can be achieved.

In particular, the distance between the centers of the light rays of two adjacent laser beams after being reflected by the corresponding mirrors is: d. According to the definition of the laser beam filling rate, the laser beam filling rate after reflection by the combined stepped mirror 20 is $$K_1 = \frac{W}{d},$$

and according to the Pythagorean theorem, the distance between the centers of the light rays is $$d = \frac{L-h}{\sqrt{2}},$$

and the centers-of-light-rays distance d satisfies: dmin=W.

It should be understood that, compared with the integrated stepped reflector in the related art, the combined stepped reflector 20 of the present disclosure has the following advantages: each mirror of the combined stepped reflector 20 has a simple structure, easy to process, can easily achieve high precision and low cost. The combined stepped reflector 20 has high precision, can reduce the loss when the laser beams are reflected, thus improving the reflectivity. The combined stepped reflector 20 can adapt to the directivity errors of different laser chips during encapsulation, reduce the loss during reflection, and improve the reflectivity.

Based on the structure of the laser beam combining apparatus 100, the present disclosure proposes a calculation method for the laser beam filling rate of the structure. Based on the light spot width of the laser chip, the thickness of the reflective mirrors is preset, so as to obtain the step width of the combined stepped reflector 20, and finally calculate the filling rate of the laser beam. The specific calculation method is as follows.

As shown in FIG. 2, the center distance of two adjacent laser beams emitted by the two-dimensional light-emitting array 10 is D, the period between the laser chips is P, the light spot width of the laser chip is W, the thickness of the reflective mirror is h (0.1 mm≤h≤8 mm), and the width of the non-overlapping reflecting surfaces 222 is L, the distance between the centers of the rays of the two adjacent laser beams reflected by the corresponding mirrors is d. The non-overlapping reflecting surfaces 222 are placed at 45° to the collimated laser beams, and the filling rate is denoted by K. According to the definition of laser beam filling rate, we get:

The initial fill rate of the collimated laser beams:

$$K_0 = \frac{W}{P} = \frac{W}{D}(P = D) \quad (1)$$

The filling rate of laser beams after reflection:

$$K_1 = \frac{W}{d} \quad (2)$$

According to the Pythagorean theorem, we have:

$$D = \frac{L-h}{\sqrt{2}} + \sqrt{2}h \quad (3)$$

$$d = \frac{L-h}{\sqrt{2}} \quad (4)$$

Convert ③ we get:

$$D = \frac{L+h}{\sqrt{2}} \quad (5)$$

It can be seen from formula ⑤ that when the value h is large, the value L is small, which will cause the laser to be blocked by the steps, that is, the former mirror will block the laser beam reflected by the latter mirror. Therefore, in order to reduce the loss of laser power during reflection and improve the reflection efficiency, it is necessary to make the mirrors not block the beams, and at the same time, considering the manufacturing errors in the actual engineering, it is necessary to reserve a certain adjustment margin C, C≥0.1, so we get the minimum value of L:

$$L\,min = h + \sqrt{2}W + C \quad (6)$$

Therefore, the present disclosure uses formula ⑥ to verify whether the value h taken can ensure that the laser beam is not blocked, or in other words, the value L calculated by formula ⑤ must be greater than or equal to the value L calculated by formula ⑥ in order that the laser beam combining apparatus 100 has high reflection efficiency.

That is, the width L satisfies: Lmin=h+√2W+C.

Further, in order to improve the filling rate, the smaller the centers-of-light-rays distance d is, the better the light spot width W of the laser chip is. According to the Pythagorean theorem, we get:

$$d\,min = W \quad (7)$$

It is worth mentioning that the width W of the light spot and the spacing D of the laser beams are determined according to the laser chips actually used in the two-dimensional light-emitting array 10. Optionally, the wavelength range of the laser chip used in the two-dimensional light-emitting array 10 is 200 nm to 1000 nm, and the corresponding light spot width W and spacing D of the laser beams are fixed values. Considering practical engineering applications, L needs to meet the minimum value requirements. Furthermore, in order to improve the optical power density, d should be as close to the minimum value as possible. By obtaining the value L based on the given thickness h of the mirror, the filling rate after reflection can be calculated to determine whether it meets the needs of use.

It can be understood that the light spot width W and the spacing D of the laser beams are determined according to the actual semiconductor laser. That is, the value D is a known value, but h a set value, and the value L can be calculated by formula ⑤. Formula ⑥ is used to determine whether the value L calculated from formula ⑤ is greater than the minimum value. If it is not greater than the minimum value, this value L is not acceptable. After the value L calculated by formula ⑤ meets the minimum value requirement of formula ⑥, the value d is calculated by formula ④. The ideal situation of the value d is close to dmin. If it is larger than dmin, the corresponding filling rate is low. Therefore, to obtain a higher filling rate, it is necessary to continuously adjust the value of h. Under the requirement of formula ⑥, the closer the value d is to dmin, the better.

Therefore, according to the calculation process of the above formula, another aspect of the present disclosure further provides a method for calculating the filling rate of the laser beam combining apparatus 100, which includes the following operations:

S1. Presetting a thickness h of the reflective mirror depending on a light spot width W of a laser chip;

S2. Obtaining a width L of the non-overlapping reflecting surface of each of the overlapping reflective mirrors 22 depending on the thickness h of the reflective mirror 222; and S3. Based on the thickness h of the reflective mirror and the width L of the non-overlapping reflecting surface 222, calculating the filling rate of the laser beams reflected by the laser beam combining apparatus 100.

Particularly, in the operation S2, the center distance D and the thickness h of the reflective mirror are substituted into formula ⑤ to calculate the width value L, and the light spot width W of the laser chip and the preset width h of the reflective mirror are substituted into formula ⑥ to obtain Lmin.

Further, in operation S3, the value L greater than Lmin and the preset thickness h of the reflective mirror is substituted into formula ④ to obtain the light center distance value d, and the value of the light spot width W is substituted into formula ⑦ to obtain dmin. Finally, the light spot width W of the laser chip and the value d close to dmin are substituted into formula ② to obtain the laser beam filling rate $K_1$ after reflection.

In general, the combined stepped reflector 20 according to the present disclosure is composed of a plurality of reflective mirrors with the same length but different widths. Each reflective mirror has a simple structure and is easy to process, which greatly reduces the processing difficulty and manufacturing cost. The surface smoothness and parallelism between the reflective surfaces can also be greatly improved. In terms of the directivity errors present in the encapsulation of different laser chips, they can also be adapted to by adjusting an individual reflective mirror to reduce the loss and improve the reflectivity.

Further, the present disclosure also provides a method for calculating the filling rate of the laser beam combining apparatus 100. Based on the light spot width of the laser chip, the thickness of the reflecting mirror is preset, and then the step width of the combined stepped reflector 20, namely the width of each of the non-overlapping reflecting surfaces 222 of the combined stepped reflector 20, is calculated based on the preset thickness value of the reflective mirror. Finally, the filling rate of the laser beams is calculated based on the thickness of the reflective mirror and the width of each of the non-overlapping reflecting surfaces 222, which provides a calculation method for engineering applications.

In addition, the present disclosure also provides a method of continuously adjusting the thickness of the reflective mirrors according to the required filling rate, so as to design the structure of the combined stepped reflector 20 accordingly. Specifically, by continuously adjusting the value h, under the requirements of formula ⑥, the closer the value d is to dmin, the better the correspondingly higher filling rate $K_1$ can be obtained. According to the finally determined value h, the corresponding structure of the combined stepped reflector 20 can be designed, that is, the present disclosure also provides a design method for increasing the filling rate.

The technical features of the above embodiments can be combined arbitrarily. For the sake of brevity, not all possible combinations of the technical features in the above embodiments are described. However, as long as there is no contradiction in the combination of these technical features, those combinations should all be considered to be fall in the scope of the description in this specification.

The above examples merely portray the illustrative embodiments of the present disclosure, and the descriptions thereof are specific and detailed, but they should not be construed as limiting the scope of the present disclosure. It should be pointed out that for those skilled in the art, without departing from the concept of the present disclosure, numerous modifications and improvements can be made, which all belong to the protection scope of the present disclosure. Therefore, the protection scope of the present disclosure should be subject to the appended claims.

What is claimed is:

1. A filling rate calculation method for a laser beam combining apparatus, wherein the laser beam combining apparatus comprises a two-dimensional light-emitting array and a combined stepped reflector used to reflect a plurality of laser beams emitted by the two-dimensional light-emitting array; wherein the two-dimensional light-emitting array is formed by encapsulating a plurality of laser chips on a substrate; wherein the combined stepped reflector is comprised of a plurality of reflective mirrors having a same length but different widths that are stacked in sequence; wherein the plurality of reflective mirrors comprise an outermost reflective mirror and a plurality of overlapping reflective mirrors stacked in succession on the outermost reflective mirror; wherein each of the plurality of overlapping reflective mirrors comprises an overlapping surface that overlaps a back surface of a previous reflective mirror and a non-overlapping reflecting surface; wherein the non-overlapping reflecting surfaces of the plurality of overlapping reflective mirrors have a same width and are each coated with a reflection film; wherein the reflective surface of the outermost reflective mirror has a width that is greater than or equal to a width of each of the non-overlapping reflecting surfaces; wherein the reflective surface of the outermost reflective mirror and the non-overlapping reflecting surfaces of the plurality of overlapping reflective mirrors are each disposed at a 45° angle with corresponding laser beams emitted by the two-dimensional light-emitting array, so that a distance between centers of the laser beams reflected by the combined stepped reflector is smaller than a distance between centers of the laser beams prior to the incidence, thereby increasing a filling rate of the laser beams emitted by the two-dimensional light-emitting array;

wherein the filling rate calculating method comprises:

presetting a thickness h of each of the plurality of reflective mirrors based on a light spot width W of the laser chip;

obtaining a width L of the non-overlapping reflecting surface of each of the plurality of overlapping reflective mirrors based on the thickness h of the reflective mirror; and based on the thickness h of the reflective mirror and the width L of the non-overlapping reflecting surface, calculating the filling rate of the laser beams reflected by the laser beam combining apparatus.

2. The filling rate calculation method as recited in claim 1, wherein let the distance between the centers of two adjacent laser beams emitted by the two-dimensional light-emitting array be D, and let the period between the laser chips of the two-dimensional light-emitting array be P, where P=D; wherein let the light spot width of the laser chip be W, the thickness of the reflecting mirror be h, the width of the non-overlapping reflecting surface be L, and the distance between the centers of the rays reflected by the respective mirrors of two adjacent laser beams be d; wherein the non-overlapping reflecting surfaces are each placed at a 45° angle to the laser beams emitted by the two-dimensional light-emitting array; according to the definition of the laser beam filling rate, we have:

an initial fill rate of the collimated laser beams:

$$K_0 = \frac{W}{P} = \frac{W}{D} \qquad (1)$$

a filling rate of the laser beams after reflection:

$$K_1 = \frac{W}{d} \qquad (2)$$

according to the Pythagorean theorem, we have:

$$D = \frac{L-h}{\sqrt{2}} + \sqrt{2}h \qquad (3)$$

$$d = \frac{L-h}{\sqrt{2}} \qquad (4)$$

convert ③ we get:

$$D = \frac{L+h}{\sqrt{2}} \qquad (5)$$

let the processing adjustment allowance of the reflective mirror be C, C≥0.1; according to the Pythagorean theorem, the width L satisfies:

$$L_{\min} = h + \sqrt{2}W + C \qquad (6)$$

the thickness h of the reflective mirror lies in the range of: 0.1 mm≤h≤8 mm;

according to the Pythagorean theorem, the ray center distance d satisfies:

$$d_{\min} = W \qquad (7).$$

3. The filling rate calculation method as recited in claim 1, wherein in the operation of obtaining the width L of the non-overlapping reflecting surface of each of the plurality of overlapping reflective mirrors based on the thickness h of the reflective mirror, the distance D and the thickness h of the reflective mirror are substituted into formula ⑤ to calculate the width value L, and the light spot width W of the laser chip and the preset width h of the reflective mirror are substituted into formula ⑥ to obtain Lmin.

4. The filling rate calculation method as recited in claim 3, wherein the value L greater than Lmin and the preset thickness h of the reflective mirror are substituted into formula ④ to obtain the distance value d between the centers of the light rays, and the value of the light spot width W is substituted into formula ⑦ to obtain dmin; and then the light spot width W of the laser chip and the value d close to dmin are substituted into formula ② to obtain the laser beam filling rate $K_1$ after reflection.

* * * * *